(12) United States Patent
Huang et al.

(10) Patent No.: US 10,269,796 B2
(45) Date of Patent: Apr. 23, 2019

(54) FORMING DOPED REGIONS IN SEMICONDUCTOR STRIPS

(71) Applicant: Taiwan Semiconductor Manufacturing Company, Ltd., Hsinchu (TW)

(72) Inventors: Shih-Wen Huang, Tainan (TW); Chia-Hui Lin, Dajia Township (TW); Shin-Yeu Tsai, Zhubei (TW); Kai Hung Cheng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/867,255

(22) Filed: Jan. 10, 2018

(65) Prior Publication Data

US 2018/0130800 A1 May 10, 2018

Related U.S. Application Data

(63) Continuation of application No. 15/281,568, filed on Sep. 30, 2016, now Pat. No. 9,881,918.

(51) Int. Cl.
| | |
|---|---|
| *H01L 27/088* | (2006.01) |
| *H01L 29/06* | (2006.01) |
| *H01L 21/762* | (2006.01) |
| *H01L 21/8234* | (2006.01) |
| *H01L 21/306* | (2006.01) |
| *H01L 21/324* | (2006.01) |
| *H01L 21/225* | (2006.01) |

(52) U.S. Cl.
CPC ...... *H01L 27/0886* (2013.01); *H01L 21/2254* (2013.01); *H01L 21/30604* (2013.01); *H01L 21/324* (2013.01); *H01L 21/76237* (2013.01); *H01L 21/823431* (2013.01); *H01L 21/823481* (2013.01); *H01L 29/0649* (2013.01)

(58) Field of Classification Search
CPC ............. H01L 27/0886; H01L 29/0649; H01L 21/76237; H01L 21/2254; H01L 21/324
See application file for complete search history.

(56) References Cited

U.S. PATENT DOCUMENTS

| | | |
|---|---|---|
| 7,022,583 B1 | 4/2006 | Leng et al. |
| 8,883,585 B1 | 11/2014 | Fumitake |

(Continued)

FOREIGN PATENT DOCUMENTS

| | | |
|---|---|---|
| KR | 20150073119 A | 6/2015 |
| TW | 201614844 A | 4/2016 |

*Primary Examiner* — Kyoung Lee
(74) *Attorney, Agent, or Firm* — Slater Matsil, LLP

(57) ABSTRACT

A method includes etching a semiconductor substrate to form trenches, with a portion of the semiconductor substrate between the trenches being a semiconductor strip, and depositing a dielectric dose film on sidewalls of the semiconductor strip. The dielectric dose film is doped with a dopant of n-type or p-type. The remaining portions of the trenches are filled with a dielectric material. A planarization is performed on the dielectric material. Remaining portions of the dielectric dose film and the dielectric material form Shallow Trench Isolation (STI) regions. A thermal treatment is performed to diffuse the dopant in the dielectric dose film into the semiconductor strip.

20 Claims, 12 Drawing Sheets

(56) References Cited

U.S. PATENT DOCUMENTS

| | | |
|---|---|---|
| 2004/0067618 A1* | 4/2004 | Chang ............... H01L 21/28273 |
| | | 438/264 |
| 2008/0254593 A1 | 10/2008 | Eun et al. |
| 2014/0117462 A1* | 5/2014 | Cheng ............... H01L 29/66803 |
| | | 257/410 |
| 2015/0179503 A1 | 6/2015 | Tsai et al. |
| 2015/0243739 A1 | 8/2015 | Chen et al. |
| 2016/0056156 A1 | 2/2016 | Ghani et al. |
| 2016/0260610 A1 | 9/2016 | Chen et al. |
| 2017/0069725 A1 | 3/2017 | Bhimarasetti et al. |

\* cited by examiner

US 10,269,796 B2

FORMING DOPED REGIONS IN SEMICONDUCTOR STRIPS

PRIORITY CLAIM AND CROSS-REFERENCE

This application is a continuation of U.S. patent application Ser. No. 15/281,568, entitled "Forming Doped Regions in Semiconductor Strips," filed on Sep. 30, 2016, which application is incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

There are various regions that may be formed by implantations. For example, anti-punch-through stoppers may be formed by performing tilted implantations after the etching of a semiconductor substrate to form trenches, which trenches are filled in subsequent steps to form STI regions. The remaining semiconductor strips defined by the trenches have high aspect ratios. Accordingly, the implanted species are unable to reach the bottom portions of the semiconductor strips since the implanted species are blocked by neighboring semiconductor strips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8A and FIG. 8B are cross-sectional views of intermediate stages in the formation of Shallow Trench Isolation (STI) regions and Fin Field-Effect Transistors (FinFETs) in accordance with some embodiments.

DETAILED DESCRIPTION

Figure 1:
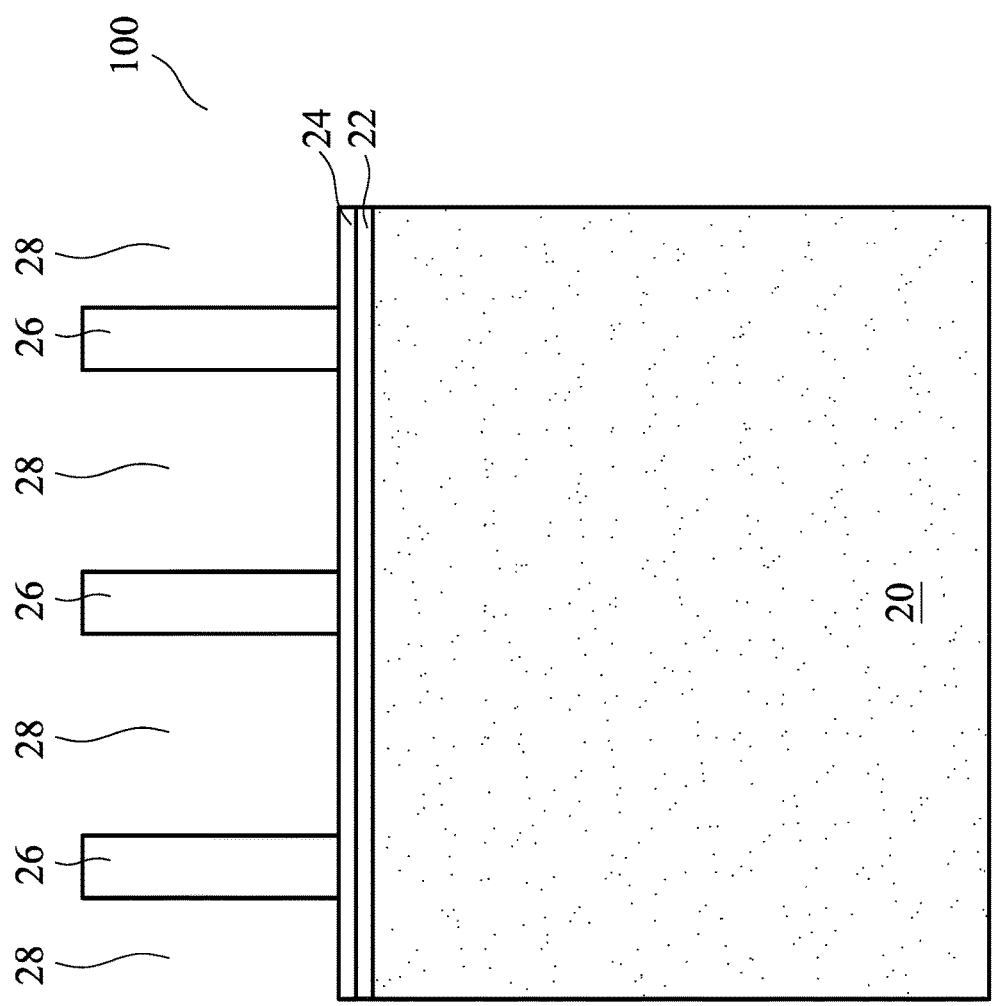

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Shallow Trench Isolation (STI) regions, Fin Field-Effect Transistors (FinFETs), and the methods of forming the same are provided. The intermediate stages in the formation of the STI regions and the FinFETs are illustrated in accordance with exemplary embodiments. Some variations of some embodiments are discussed. Throughout the various views and illustrative embodiments, like reference numbers are used to designate like elements.

Figure 10:
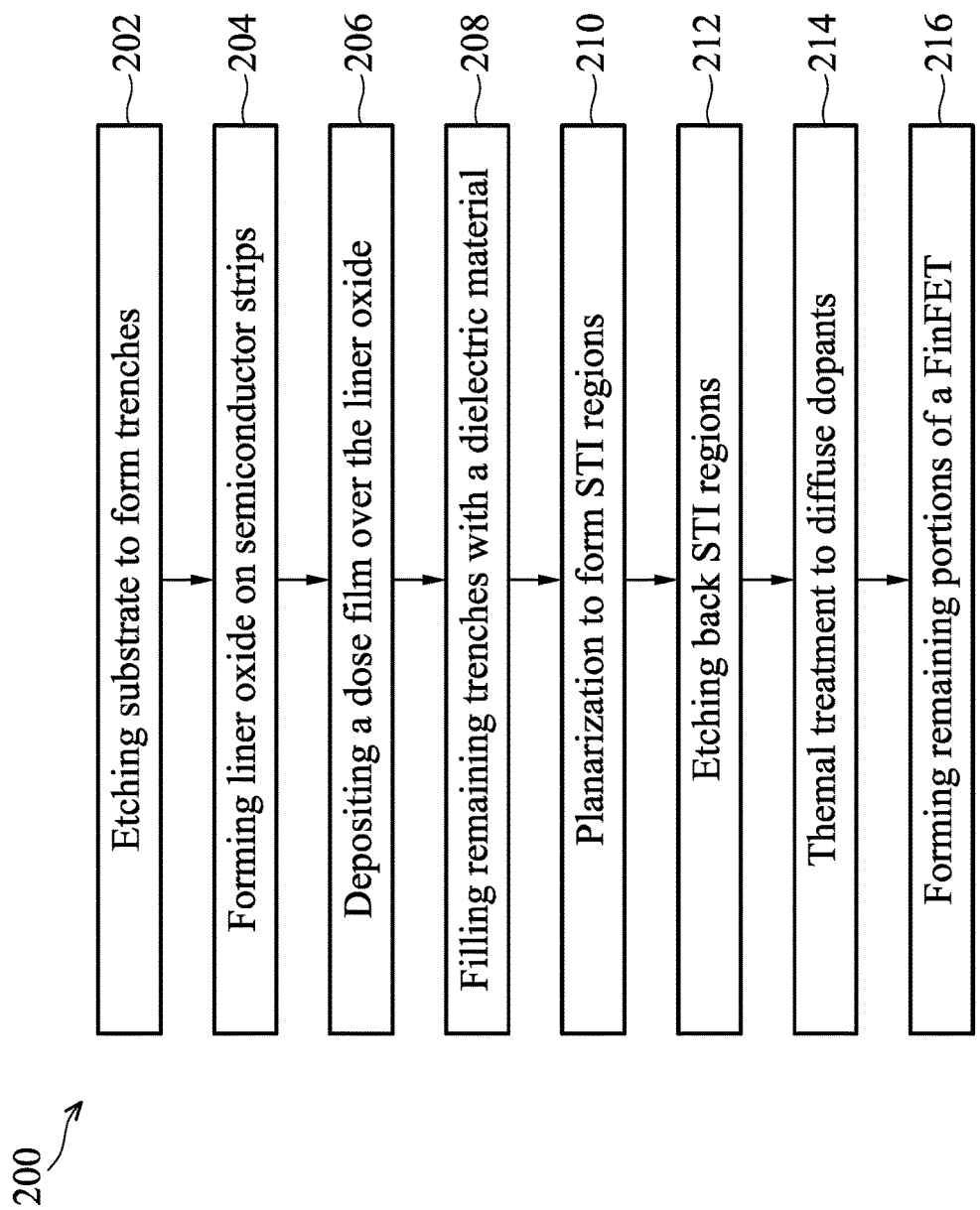
FIG. 10 illustrates a process flow for forming STI regions and a FinFET in accordance with some embodiments.

FIGS. 1 through 8A illustrate the cross-sectional views of intermediate stages in the formation of STI regions and a FinFET in accordance with some embodiments. The steps shown in FIGS. 1 through 8A are also illustrated schematically in the process flow shown in FIG. 10.

Referring to FIG. 1, semiconductor substrate 20, which is a part of semiconductor wafer 100, is provided. In accordance with some embodiments of the present disclosure, semiconductor substrate 20 includes crystalline silicon. Other commonly used materials, such as carbon, germanium, gallium, boron, arsenic, nitrogen, indium, and/or phosphorus, and the like, may also be included in semiconductor substrate 20. Semiconductor substrate 20 may also be formed of other semiconductor materials such as III-V compound semiconductor materials. Semiconductor substrate 20 may be a bulk substrate or a Semiconductor-On-Insulator (SOI) substrate.

Pad layer 22 and mask layer 24 are formed on semiconductor substrate 20. Pad layer 22 may be a thin film including silicon oxide. In accordance with some embodiments of the present disclosure, pad oxide layer 22 is formed in a thermal oxidation process, wherein a top surface layer of semiconductor substrate 20 is oxidized. Pad layer 22 acts as an adhesion layer between semiconductor substrate 20 and mask layer 24. Pad layer 22 may also act as an etch stop layer for etching mask layer 24. In accordance with some embodiments of the present disclosure, mask layer 24 is formed of silicon nitride, for example, using Low-Pressure Chemical Vapor Deposition (LPCVD). In accordance with other embodiments of the present disclosure, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes. Mask layer 26 is formed over mask layer 24 and is then patterned, forming openings 28 in mask layer 26. Mask layer 26 may be formed of photo resist or a hard mask material such as silicon nitride.

Figure 2:
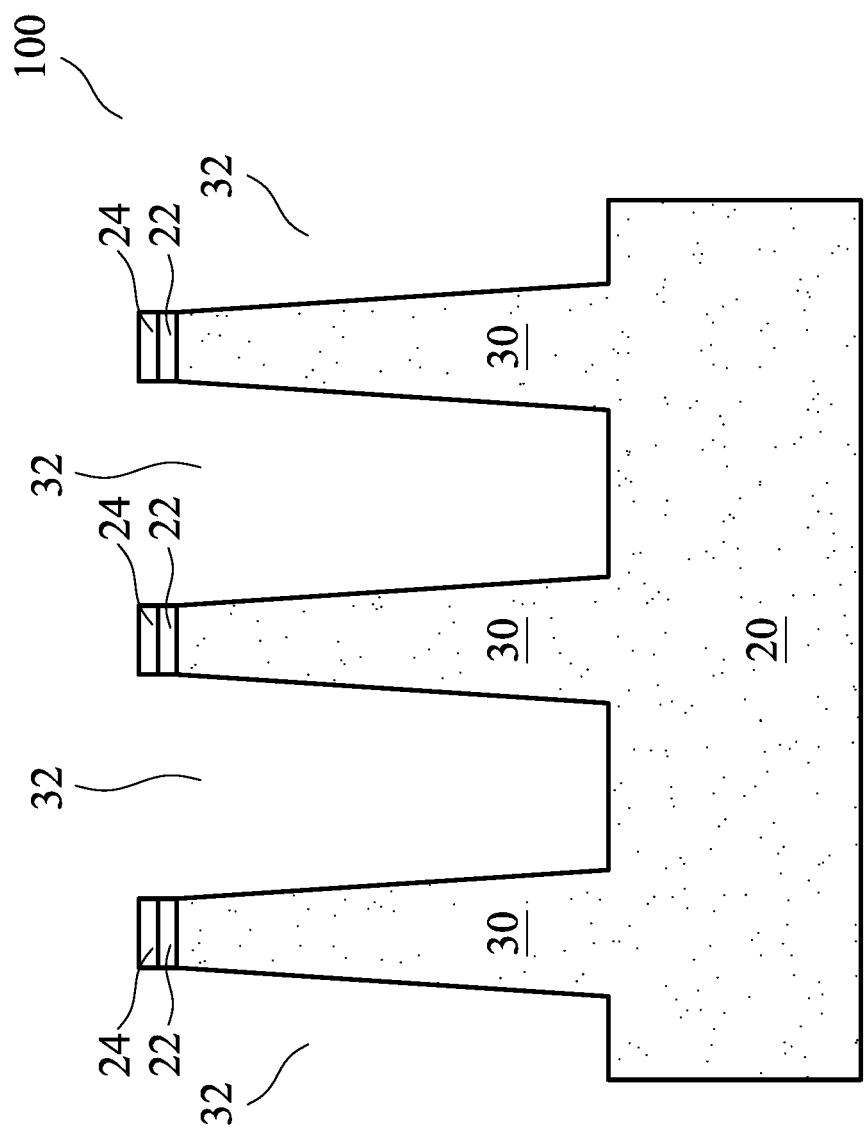

Referring to FIG. 2, mask layer 24 and pad layer 22 are etched, exposing underlying semiconductor substrate 20. The exposed semiconductor substrate 20 is then etched, forming trenches 32. The respective step is shown as step 202 in the process flow shown in FIG. 10. The portions of semiconductor substrate 20 between neighboring trenches 32 are referred to as semiconductor strips 30 hereinafter. Trenches 32 may have the shape of strips (when viewed in the top view of wafer 100) that are parallel to each other, and trenches 32 are closely located from each other. In accordance with some embodiments of the present disclosure, the aspect ratio (the ratio of depth to width) of trenches 32 is greater than abut 7, and may be greater than about 10.

After the etching of semiconductor substrate 20, mask layer 26 (FIG. 1) is removed. Next, a cleaning step may be performed. The cleaning may be performed using diluted hydrofluoric (HF) acid, for example.

Figure 3:
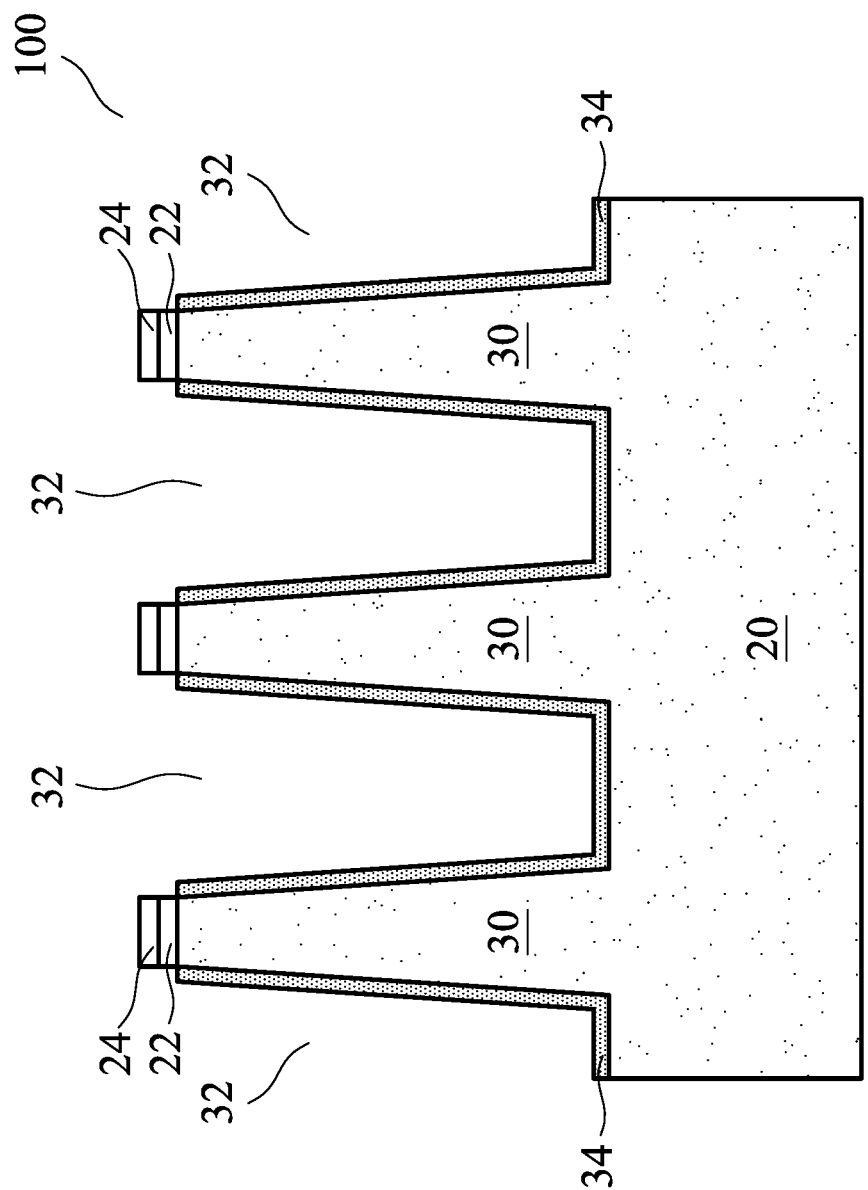

In accordance with some embodiments, liner oxide 34 is formed at the bottoms of trenches 32 and extending on the sidewalls of semiconductor strips 30, as is shown in FIG. 3. The respective step is shown as step 204 in the process flow shown in FIG. 10. Liner oxide 34 may be a conformal layer, whose horizontal portions and vertical portions have thicknesses close to each other. The thickness of liner oxide 34 may be in the range between about 10 Å and about 100 Å. In accordance with some embodiments of the present disclosure, liner oxide 34 is formed by oxidizing wafer 100 in an oxygen-containing environment, for example, through Local Oxidation of Silicon (LOCOS), wherein oxygen ($O_2$) may be included in the respective process gas. In accordance with other embodiments of the present disclosure, liner oxide 34 is formed using In-Situ Steam Generation (ISSG), for example, with water steam or a combined gas of hydrogen ($H_2$) and oxygen ($O_2$) used to oxidize semiconductor strips 30. The ISSG oxidation may be performed at an elevated temperature. In accordance with yet other embodiments, liner oxide 34 is formed using a deposition technique such as Sub Atmospheric Chemical Vapor Deposition (SACVD). The formation of liner oxide 34 may result in the rounding of the corners of trenches 32, which reduces the electrical fields of the resulting FinFET, and hence improves the performance of the resulting integrated circuit. In accordance with alternative embodiments of the present disclosure, the formation of liner oxide 34 is skipped. Accordingly, the subsequently formed dose film 36 (FIG. 4) is in physical contact with substrate 20.

During the formation of liner oxide 34, liner oxide 34 is not doped with additional n-type dopant (such as phosphorous, arsenic, antimony) and p-type dopant (such as boron and indium). Accordingly, the p-type and n-type dopant concentration in liner oxide 34 may be equal to or close to zero when it is formed by deposition, or may be close to the respective dopant concentration in substrate 20 and semiconductor strips 30 when it is formed by oxidizing substrate 20 and semiconductor strips 30.

Figure 4:
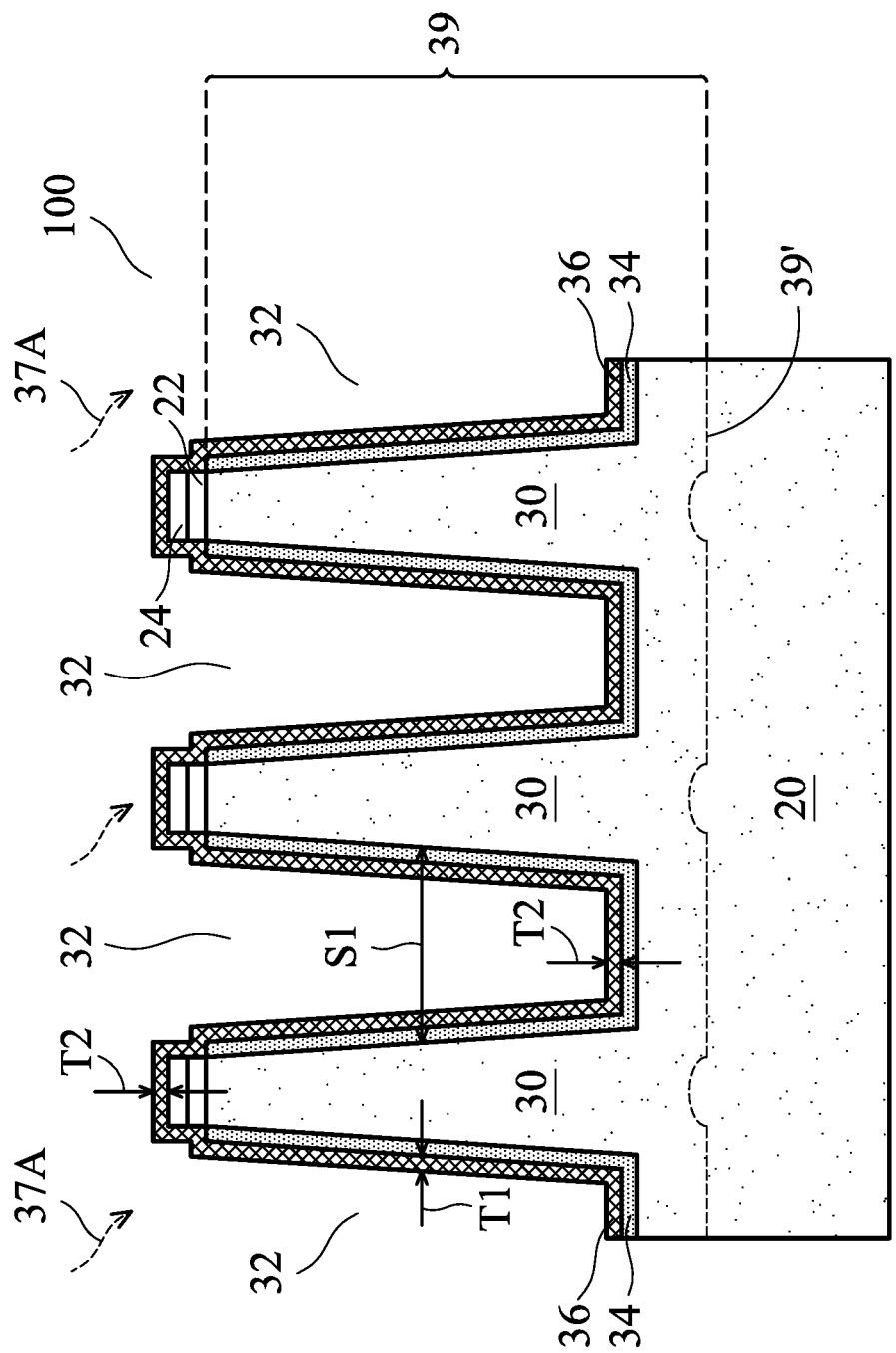

FIG. 4 illustrates the deposition/formation of dose film 36, which is also a dielectric layer. The respective step is shown as step 206 in the process flow shown in FIG. 10. In the embodiments wherein liner oxide 34 is formed, liner oxide 34 is in contact with semiconductor strips 30, and dose film 36 is formed on, and contacting, liner oxide 34. In accordance with alternative embodiments of the present disclosure, liner oxide 34 is not formed, and hence dose film 36 is in contact with the sidewalls of semiconductor strips 30 and the top surfaces of the underlying substrate 20. In accordance with some embodiments of the present disclosure, dose film 36 includes a base material and a p-type or an n-type dopant, and the conductivity type of the dopant depends on the regions to be formed by dose film 36, as is discussed in detail in subsequent paragraphs. During the deposition of dose film 36, the p-type or the n-type dopant is in-situ doped with the dopant with the proceeding of the deposition. In accordance with some embodiments of the present disclosure, dose film 36 includes an n-type dopant such as phosphorous, arsenic, antimony, or combinations thereof. In accordance alternative embodiments of the present disclosure, dose film 36 includes a p-type dopant such as boron, indium, or combinations thereof.

The base material of dose film 36 includes silicon oxide ($SiO_2$) in accordance with some embodiments. In accordance with alternative embodiments, the base material of dose film 36 includes silicon nitride or other dielectric materials such as silicon carbide, silicon oxynitride, silicon oxynitride, or the like. Dose film 36 may be formed using Chemical Vapor Deposition (CVD), Atomic Deposition (ALD), Low Pressure Chemical Vapor Deposition (LP-CVD), or the like. In accordance with some embodiments of the present disclosure, dose film 36 is conformal or close to conformal, wherein thickness T1 of the vertical portions of dose film 36 is close to thickness T2 of the horizontal portions of dose film 36. For example, the difference between thicknesses T1 and T2 may be smaller than 20 percent of both of thicknesses T1 and T2. Dose film 36 has bottom portions at the bottoms of trenches 32, and sidewall portions on the sidewalls of semiconductor strips 30. Dose film 36 also includes some portions on the sidewalls and top surfaces of pad layer 22 and mask layer 24.

The dopant may be added by introducing the dopant-containing process gases in the precursors for forming dose film 36. For example, process gases such as $BF_3$, $B_2H_6$, Triethylborate (TEB), Trimethylphosphite (TMPi), $PH_3$, $AsH_3$, may be added, depending on what dopant is to be doped in dose film 36. The concentration of the dopant in dose film 36 may be in the range between about $10^{14}$ atom/cm$^3$ and about $10^{16}$ atom/cm$^3$. The dopant may be implanted with a rate in the range between about 1 kcps (kilo counts per second) and about 6 kcps. Thickness T1 may be in the range between about 5 percent and about 15 percent of spacing S1, which is the spacing between neighboring semiconductor strips 30, so that the dopant diffused (in subsequent steps) from dose film 36 may have a desirable concentration in semiconductor strips 30.

Figure 8A:
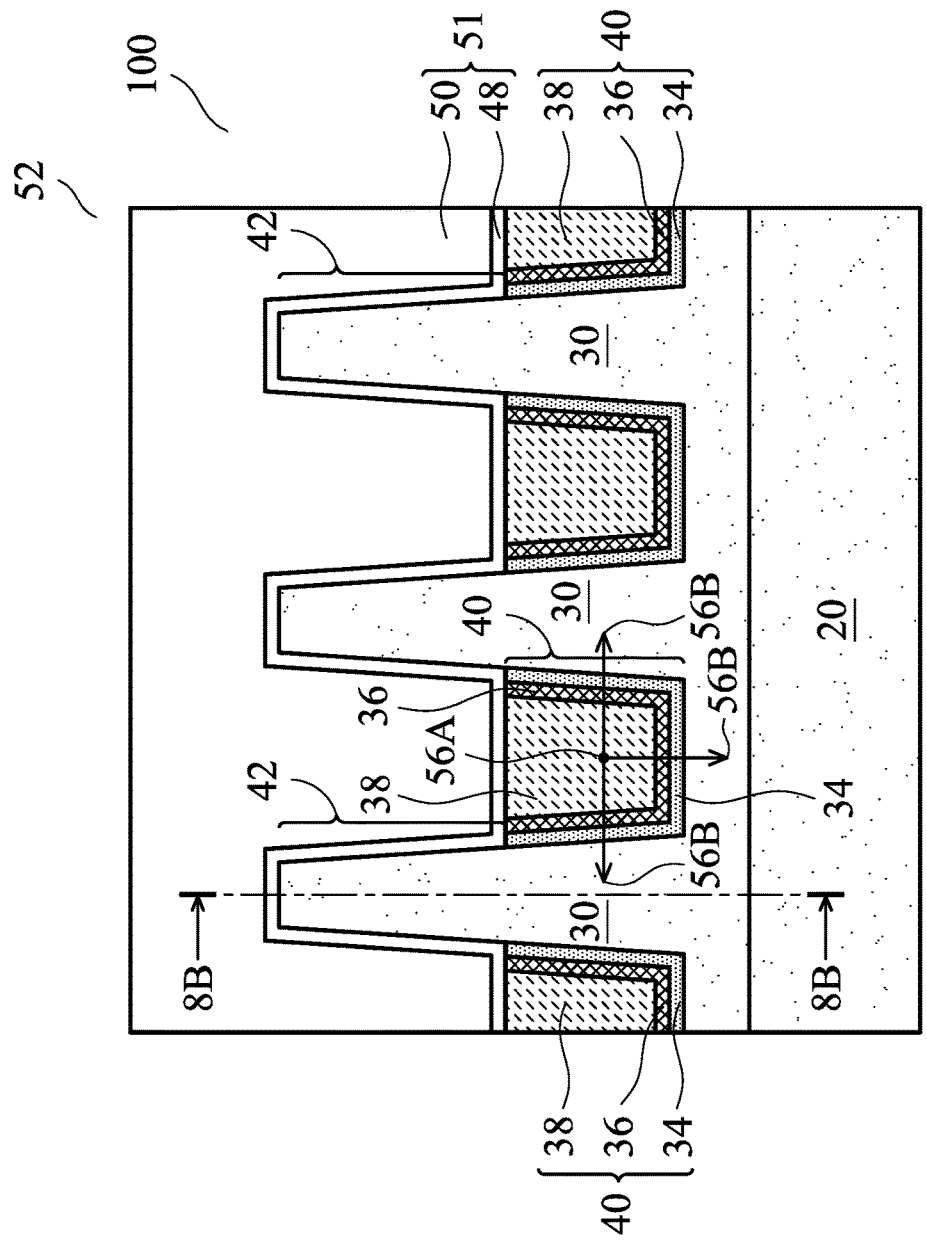
Figure 8B:
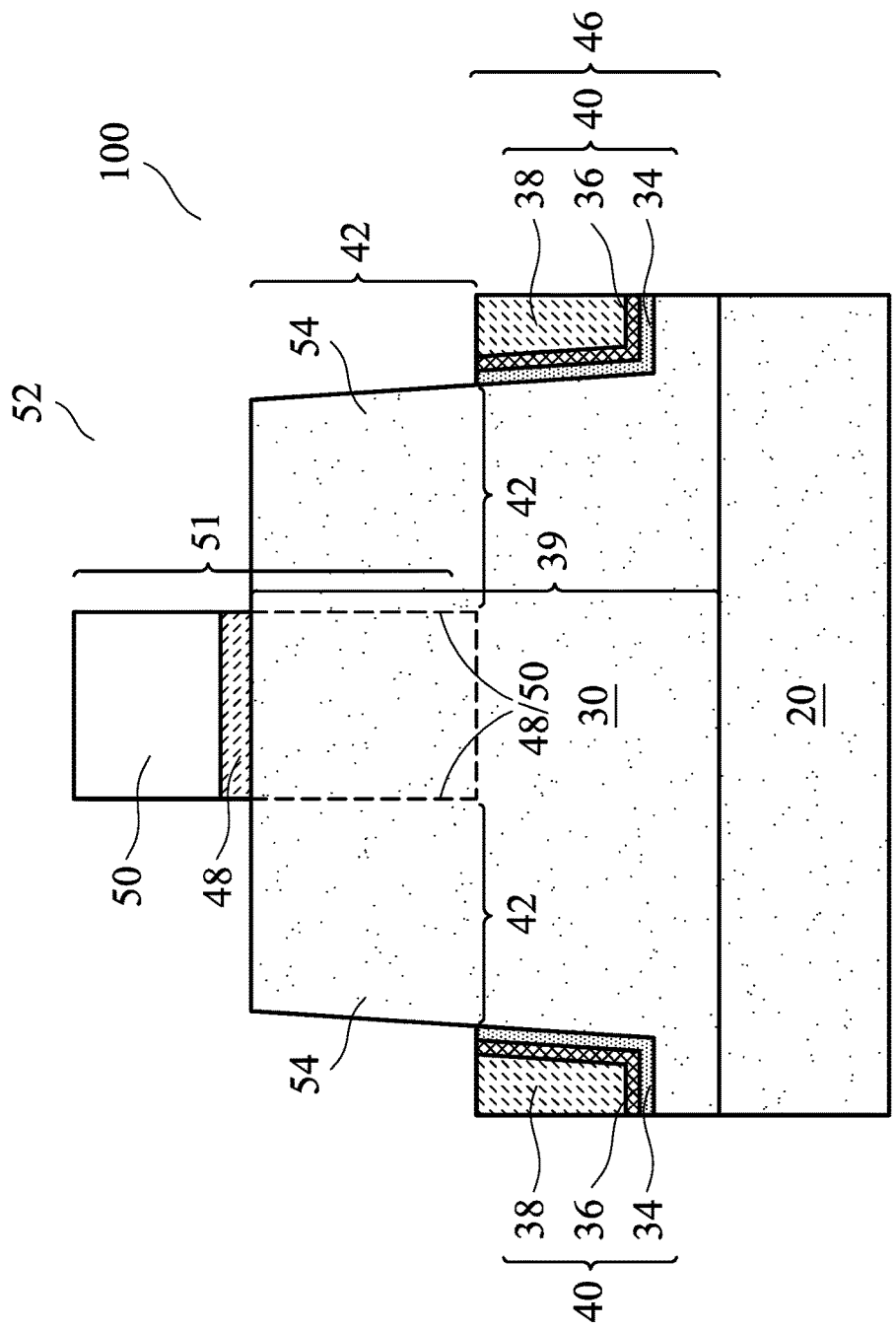

In accordance with some embodiments of the present disclosure, a thermal treatment 37A is performed to drive the dopant in dose film 36 into semiconductor substrate 20 and semiconductor strips 30. In accordance with alternative embodiments, thermal treatment 37A is not performed at this time, while a thermal treatment is performed in a subsequent step. In accordance with some exemplary embodiments, thermal treatment 37A is used to form a well region for a FinFET, wherein the dopant in dose film 36 is diffused into semiconductor substrate 20 and semiconductor strips 30 to form well region 39. The conductivity type of the dopant may be opposite to the conductivity type of the subsequently formed source/drain regions 54 (FIG. 8B). For example, when source/drain regions 54 are of p-type, and the respective FinFET is a p-type FinFET, the dopant in dose film 36 is of n-type, and vice versa. The corresponding diffused region (such as a well region) is schematically illustrated as the region 39, which includes semiconductor strips 30 and the portion of semiconductor substrate 20 over dashed line 39'.

In accordance with some embodiments of the present disclosure, thermal treatment 37A is performed using Rapid Thermal Anneal (RTA). The annealing temperature may be in the range between about 800° C. and about 1,200° C. The annealing duration may be in the range between about 10 seconds and about 60 seconds. The anneal may be performed in a chamber, wherein no oxygen-containing gas is introduced.

In accordance with alternative embodiments of the present disclosure, thermal treatment 37A is performed using a furnace thermal treatment. The annealing temperature may be in the range between about 400° C. and about 700° C. The annealing duration may be in the range between about 20 minutes and about 5 hours. The anneal may also be performed with no additional oxygen-containing gas (other than the oxygen in the ambient gas (such as open air or clean air)) added.

Figure 5:
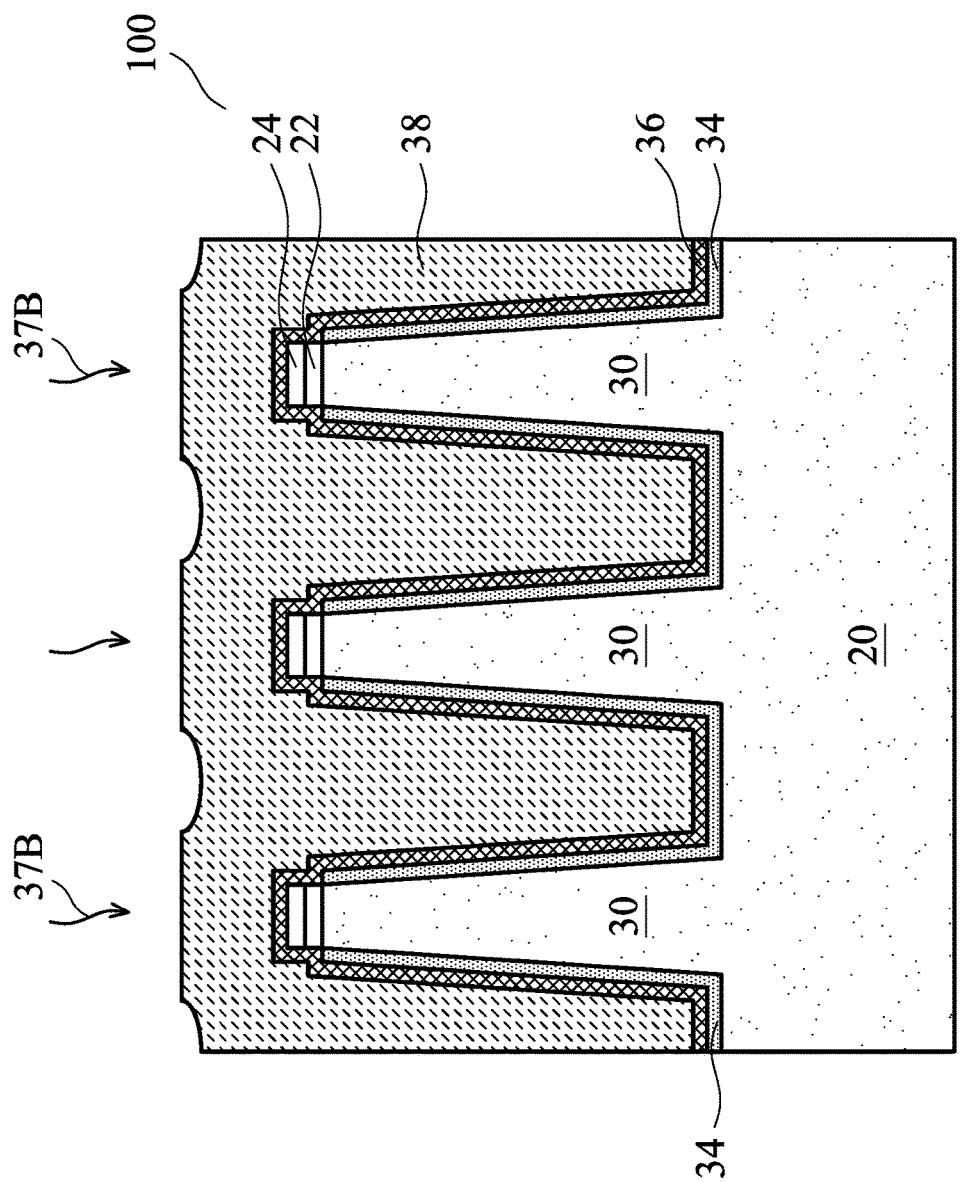

Dielectric material 38 is then formed to fill the remaining portions of trenches 32, resulting in the structure shown in FIG. 5. The respective step is shown as step 208 in the process flow shown in FIG. 10. The formation method of dielectric material 38 may be selected from Flowable Chemical Vapor Deposition (FCVD), spin-on coating, CVD, ALD, High-Density Plasma Chemical Vapor Deposition (HDPCVD), LPCVD, and the like. In accordance with some embodiments, dielectric material 38 is not doped with p-type and n-type dopants during its formation.

In accordance with some embodiments in which FCVD is used, a silicon- and nitrogen-containing precursor (for example, trisilylamine (TSA) or disilylamine (DSA)) is used, and hence the resulting dielectric material 38 is flowable (jelly-like). In accordance with alternative embodiments of the present disclosure, the flowable dielectric material 38 is formed using an alkylamino silane based precursor. During the deposition, plasma is turned on to activate the gaseous precursors for forming the flow able oxide.

After dielectric material 38 is formed, an anneal/curing is performed, which converts flowable dielectric material 38 into a solid dielectric material. The solidified dielectric material 38 is also referred to as dielectric material 38.

In accordance with some exemplary embodiments of the present disclosure, the anneal is performed in an oxygen-containing environment. The annealing temperature may be higher than about 200° C., for example, in a temperature range between about 200° C. and about 700° C. During the thermal treatment, an oxygen-containing process gas is conducted into the process chamber in which wafer 100 is placed. The oxygen-containing process gas may include oxygen ($O_2$), ozone ($O_3$), or combinations thereof. Steam ($H_2O$) may also be used, and may be used without oxygen ($O_2$) or ozone, or may be used in combination with oxygen ($O_2$) and/or ozone. The treatment time may be between about 4 hours and about 7 hours. As a result of the thermal treatment, dielectric layer 38 is cured and solidified.

Thermal treatment 37A, rather being performed in the step as shown in FIG. 4, may alternatively be performed after the anneal/curing of dielectric material 38, which is shown as thermal treatment 37B in FIG. 5. The thermal treatment 37A or 37B, in order to drive the dopant in dose film 36 into semiconductor strip 30, may be performed at a higher temperature and for a shorter duration than the anneal for curing dielectric layer 38, so that the diffusing rate is increased, and the damage caused by the thermal treatment is reduced. The treatment 37B may be performed using a method selected from the same candidate methods and process conditions for thermal treatment 37A.

Figure 6:
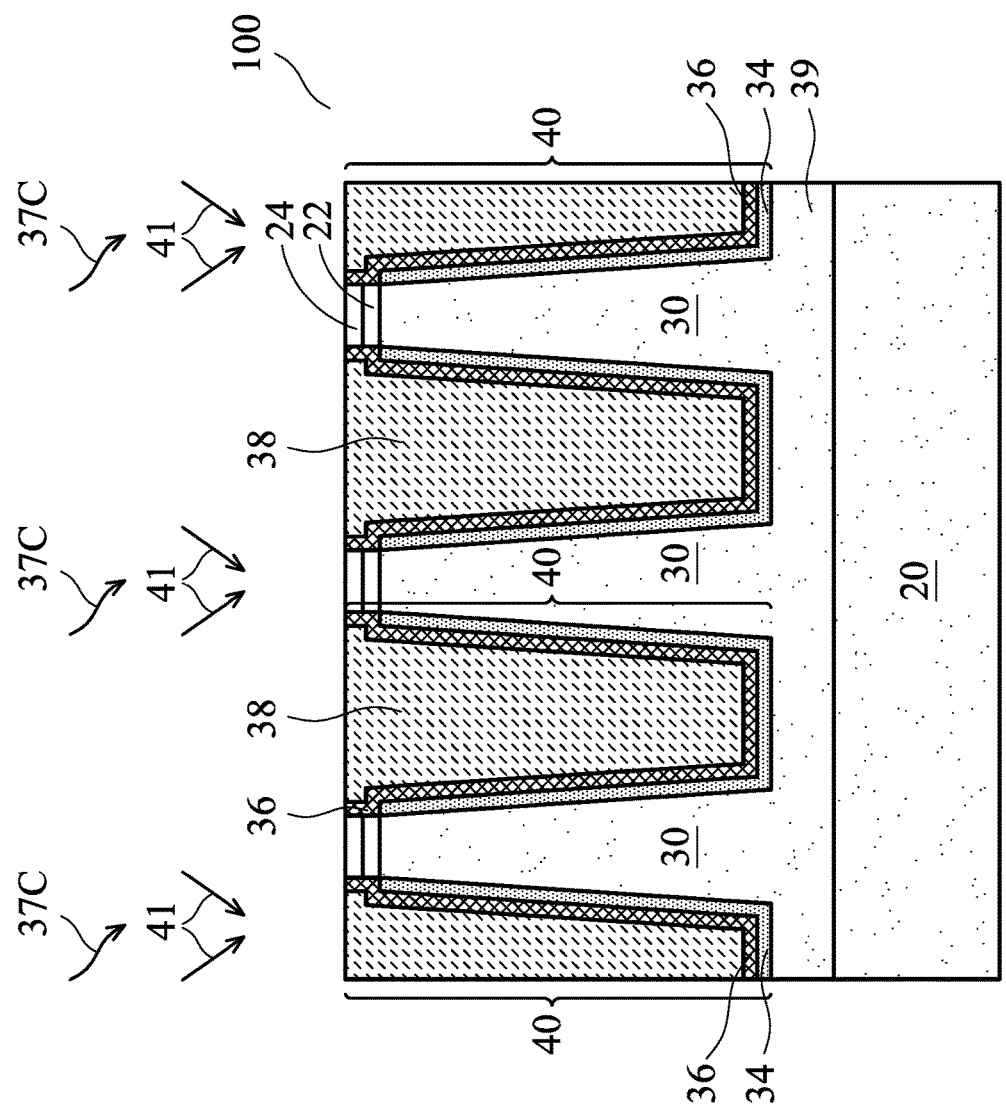

A planarization such as a Chemical Mechanical Polish (CMP) is then performed, as shown in FIG. 6. The respective step is shown as step 210 in the process flow shown in FIG. 10. STI regions 40 are thus formed, which include the remaining portions of liner oxide 34, dose film 36, and dielectric region 38. Mask layer 24 may be used as the CMP stop layer, and hence the top surface of mask layer 24 is substantially level with the top surface of dielectric regions 38 and the top edges of dose film 36.

Similarly, rather than performing the thermal treatments 37A and 37B, the thermal treatment may also be performed after the CMP, and the corresponding thermal treatment is shown as 37C. The treatment 37C may be performed using a method selected from the same candidate methods and process conditions for thermal treatment 37A.

In accordance with some embodiments of the present disclosure, a well implantation is performed to form well region 39. The implantation may be tilted, as illustrated by arrows 41. In accordance with some embodiments, the well implantation is performed in addition to the well diffusion as shown by 37A (FIG. 4), 37B (FIG. 5), or 37C (FIG. 6). In accordance with alternative embodiments, the well implantation 41 is performed, and none of thermal treatment 37A, 37B, and 37C is performed.

Figure 7:
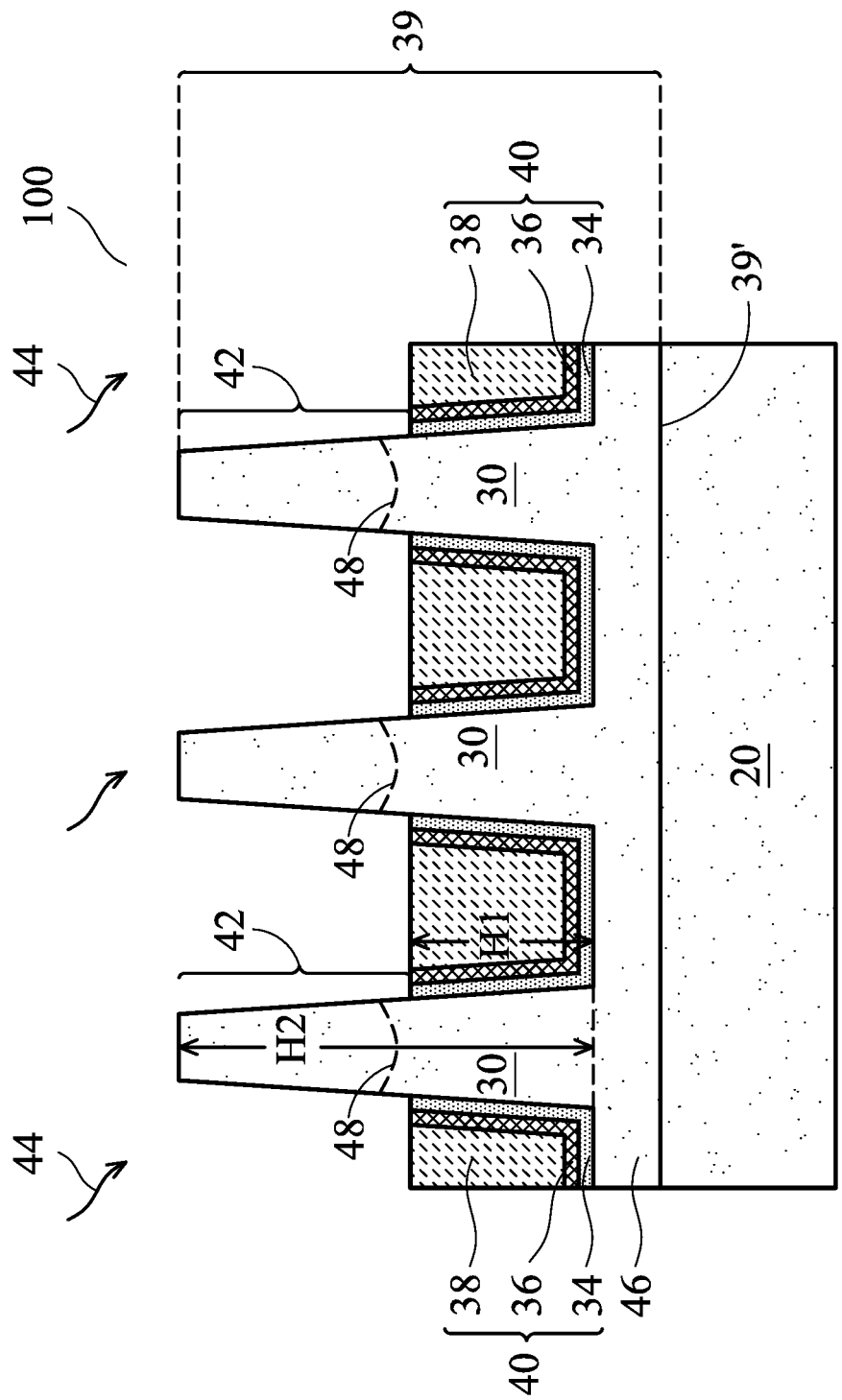

The mask layer 24 as shown in FIG. 6 is then removed. Mask layer 24, if formed of silicon nitride, may be removed in a wet process using hot $H_3PO_4$ as an etchant. Next, the structure shown in FIG. 6 is used to form semiconductor fins through the recessing (etching back) of STI regions 40, and pad layer 22 is also removed. The respective step is shown as step 212 in the process flow shown in FIG. 10. The resulting structure is shown in FIG. 7. The recessing of STI regions 40 may be performed using a dry etch process or a wet etch process. In accordance with some embodiments of the present disclosure, the recessing of STI regions 40 is performed using a dry etch method, in which the process gases including $NH_3$ and HF are used. In accordance with alternative embodiments of the present disclosure, the recessing of STI regions 40 is performed using a wet etch method, in which the etchant solution is a dilution HF solution, which may have an HF concentration lower than about 1 percent.

The height H1 of the remaining STI regions 40 may be in the range between about 10 percent and about 50 percent of height H2 of semiconductor strips 30. The protruding portions of semiconductor strips 30, which protrude higher than the top surfaces of the remaining STI regions 40, become semiconductor fins 42.

In accordance with some embodiments of the present disclosure, after the recessing of STI regions 40, thermal treatment 44 is performed. Thermal treatment 44 may be performed using a method selected from the same candidate methods and process conditions for thermal treatment 37A, which include RTA and furnace anneal, for example.

As a result of thermal treatment 44, the dopant in dose film 36 is diffused into the lower portion of semiconductor strips 30 to form anti-punch-through stoppers 46. The upper portion of semiconductor strips 30 is not diffused with the dopant. The respective step is shown as step 214 in the process flow shown in FIG. 10. Anti-punch-through stopper 46 is schematically shown as lower than dashed line 48 and higher than dashed line 39'. During the thermal treatment, the dopant diffused from the portions of dose film 36 on opposite sidewalls of the same semiconductor strip 30 may be joined, so that the diffused dopant laterally extends throughout semiconductor strips 30. Alternatively stated, the dopants may diffuse laterally beyond the middle vertical line of semiconductor strips 30. In accordance with some embodiments of the present disclosure, for forming the anti-punch-through stopper, the conductivity type of the dopant is the same as that of the well region, and is opposite to the conductivity of the subsequently formed source/drain regions 54 (FIG. 8B). For example, when source/drain regions 54 are of p-type, and the respective FinFET is a p-type FinFET, the dopant in anti-punch-through stoppers 46 is of n-type, and vice versa.

In accordance with some embodiments, thermal treatment 44 is performed, while none of the thermal treatments 37A (FIG. 4), 37B (FIG. 5), and 37C (FIG. 6) is performed. In accordance with alternative embodiments, one of thermal treatments 37A, 37B, and 37C is performed, while thermal treatment 44 (FIG. 7) is not performed. In accordance with alternative embodiments, one of thermal treatments 37A, 37B, and 37C is performed, and thermal treatment 44 (FIG. 7) is also performed. The dual thermal treatment advantageously causes the formation of the well region 39 and anti-punch-through stopper 46 using the same dose film 36.

After STI regions 40 are recessed to form semiconductor fins 42, a plurality of process steps are formed on semiconductor fins 42, which process steps may include well implantations, gate stack formation, a plurality of cleaning steps, and the like. FinFETs are thus formed. The respective step is shown as step 216 in the process flow shown in FIG. 10. An exemplary FinFET 52 is illustrated in FIG. 8A, wherein the illustrated gate stack 51 includes gate dielectric 49 on the top surfaces and sidewalls of fins 42, and gate electrode 50 over gate dielectric 49. Gate dielectric 49 may be formed through a thermal oxidation, and hence may include thermal silicon oxide. The formation of gate dielectric 49 may also include a deposition step, and the resulting gate dielectric 49 may include a high-k dielectric material or a non-high-k dielectric material. Gate electrode 50 is then formed on gate dielectric 49. The formation processes of these components are not discussed in detail. Gate dielectric 49 and gate electrode 50 may be formed using a gate-first approach or a gate-last approach. The details of the gate-first approach or the gate-last approach are not described herein. The remaining components of FinFET 52, which include source and drain regions and source and drain silicides (not in the illustrated plane), are then formed.

FIG. 8B illustrates a cross-sectional view of FinFET 52, wherein the cross-sectional view is obtained from the plane containing line 8B-8B in FIG. 8A. As shown in FIG. 8B, anti-punch-through stopper 46 and/or well region 39 are illustrated as extending into semiconductor fin 42 and the lower portion of semiconductor substrate 30, and into the portion of semiconductor substrate 20 directly underlying STI regions 40. The conductivity type of the dopant in dose film 36 is opposite to the conductivity type of source/drain regions 54. Also, the conductivity type of anti-punch-through stopper 46 and well region 39 is opposite to the conductivity type of source/drain regions 54.

Figure 9:
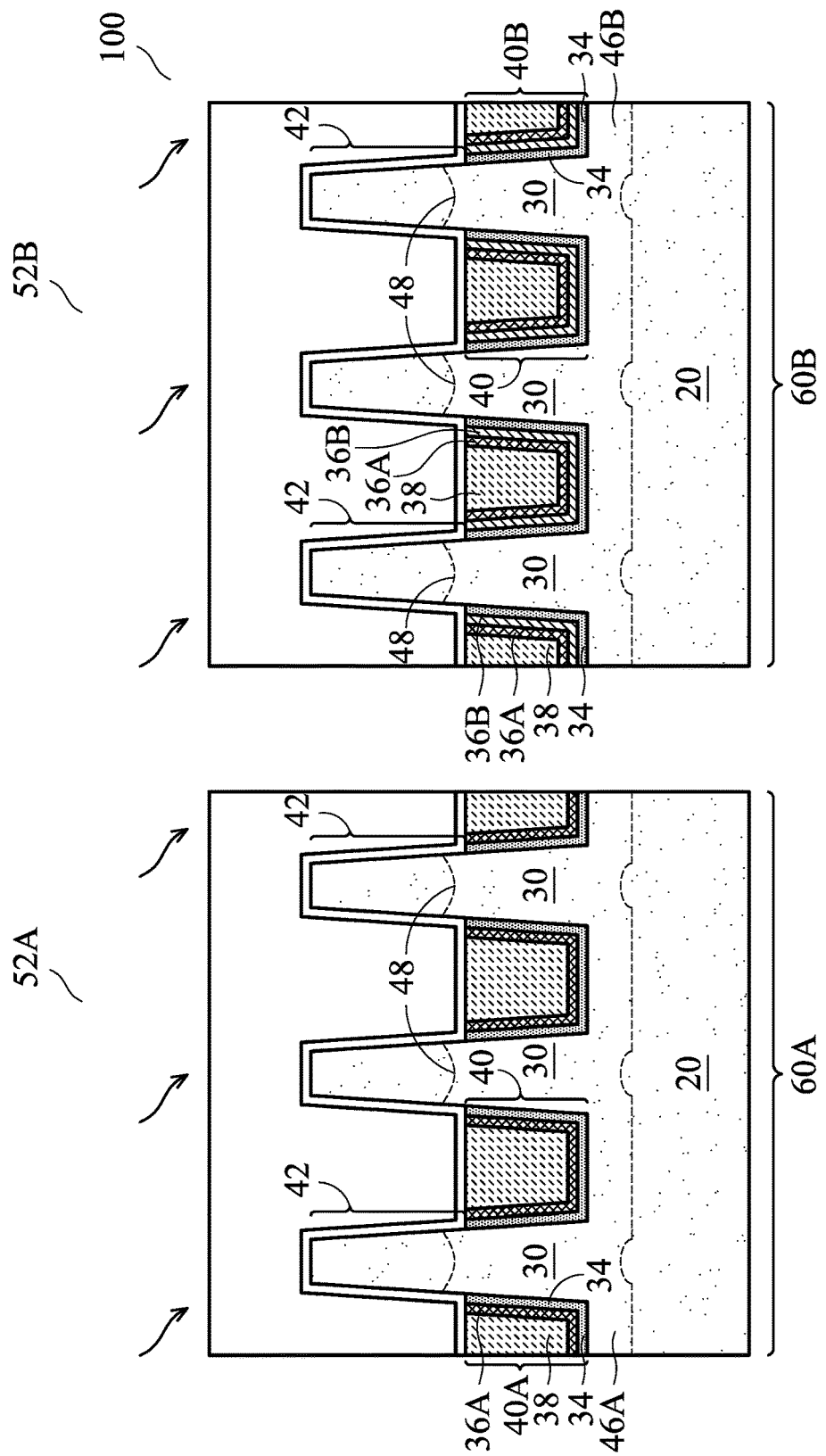
FIG. 9 illustrates a cross-sectional view of an n-type FinFET and a p-type FinFET in accordance with some embodiments.
Figure 11:
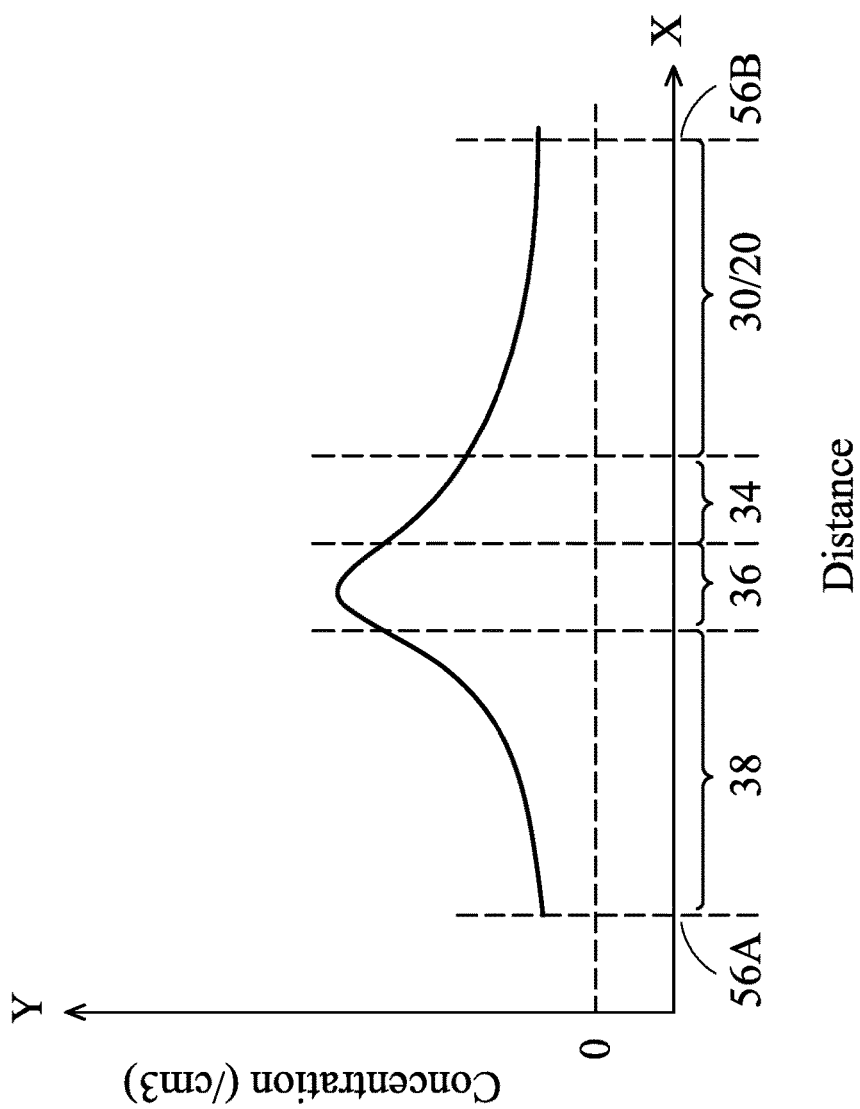
FIG. 11 illustrates a schematic distribution profile of a dopant initially doped in a dose film in accordance with some embodiments.

FIG. 11 illustrates a dopant profile, which schematically illustrates the relative dopant concentration of the dopant. The X-axis represents the distance from point 56A in the directions toward points 56B, as shown in FIG. 8A. As shown in FIG. 9, the dopant concentrations of the dopant are the highest in dose film 36 since the dopant is diffused away from dose film 36. The dopant concentrations of the dopant continuously drop from dose film 36 to both point 56A, and from dose film 36 to point 56B. It is appreciated that even if there is a well implantation, the dopant concentration resulted from the well implantation is lower than the dopant concentration caused by the diffusion since punch-through stopper 46 desires higher dopant concentration than the well region. Accordingly, in the final device (for example, as shown n FIG. 8A), the trend of the dopant concentration is not affected (although the values may be affected) by the well implantation, and may still be represented by the curve shown in FIG. 11.

FIG. 9 illustrates a complementary MOS device formed in accordance with some embodiments of the present disclosure. In accordance with some embodiments, n-type FinFET region 60A is used for forming n-type FinFET 52A. STI region 40A is formed in FinFET region 60A, and includes dose film 36A. Dose film 36A is in-situ doped with a p-type dopant, and is formed on the respective liner oxide 34. P-type FinFET region 60B is used for forming p-type FinFET 52B. STI region 40B is in FinFET region 60B. In accordance with some embodiments, STI region 40B includes dose film 36B and dose film 36A over dose film 36B. In accordance with other embodiments, STI region 40B includes dose film 36B (but no dose film 36A), with dielectric region 38 over and contacting dose film 36B. Dose film 36B is in-situ doped with an n-type dopant, and is formed on the respective liner oxide 34. Dose films 36A in FinFET regions 60A and 60B are formed simultaneously. Dose films 36A and 36B as shown in FIG. 9 may be formed by blanket forming dose film 36B in both n-type FinFET region 60A and p-type FinFET region 60B, and removing dose film 36B from n-type FinFET region 60A, followed by forming dose film 36A in both n-type FinFET region 60A and p-type FinFET region 60B.

A thermal treatment is performed to diffuse the dopants in dose films 36A and 36B as shown in FIG. 9 into semiconductor strips 30. The thermal treatment may be performed after the recessing of STI regions as shown in FIG. 7. In n-type FinFET region 60A, the punch-through stopper 46A is formed as a p-type region. In p-type FinFET region 60B, the punch-through stopper 46B is formed as an n-type region. The dopants in both dose films 36A and 36B are diffused into semiconductor strips 30, which dopants have opposite conductivity types and hence neutralize each other. Since dose film 36B is closer to semiconductor strips 30A, its dopant dominates. In addition, the doping concentration of the n-type dopant in-situ doped into dose film 36B may be higher than the doping concentration of the p-type dopant in-situ doped into dose film 36A. In the resulting structure, punch-through stopper 46B is dominated by the n-type dopant, and is shown as being of n-type.

In the resulting dopant concentration profile of STI region 40B, the n-type dopant in-situ doped in dose film 36B still has the highest concentration in dose film 36B after the thermal treatment, and the dopant concentrations increasingly decrease in regions away from dose film 36B. Similarly, the p-type dopant in-situ doped in dose film 36A still has the highest concentration in dose film 36A after the thermal treatment, and the dopant concentrations increasingly decrease in regions away from dose film 36A. The dopant concentration profile of STI region 40A is shown in FIG. 11.

The embodiments of the present disclosure have some advantageous features. By using the dose films to carry dopants, the bottom portions of the semiconductor strips, which are difficult to dope using implantation, may be doped to have a desired high concentration.

In accordance with some embodiments of the present disclosure, a method includes etching a semiconductor substrate to form trenches, with a portion of the semiconductor substrate between the trenches being a semiconductor strip, and depositing a dielectric dose film on sidewalls of the semiconductor strip. The dielectric dose film is doped with a dopant of n-type or p-type. The remaining portions of the trenches are filled with a dielectric material. A planarization is performed on the dielectric material. Remaining portions of the dielectric dose film and the dielectric material form STI regions. A thermal treatment is performed to diffuse the dopant in the dielectric dose film into the semiconductor strip.

In accordance with some embodiments of the present disclosure, a method includes etching a semiconductor substrate to form trenches, with a portion of the semiconductor substrate between the trenches being a semiconductor strip, forming a liner oxide on sidewalls of the semiconductor strip, and depositing a dielectric dose film over the liner oxide. The dielectric dose film extends into the trenches, and the dielectric dose film is doped with a dopant of p-type or n-type. The remaining portions of the trenches are filled with a dielectric material. A planarization is performed on the dielectric material, and remaining portions of the liner oxide, the dielectric dose film, and the dielectric material form STI regions. The STI regions are etched back, and a top portion of the semiconductor strip protrudes over top surfaces of remaining portions of the STI regions to form a semiconductor fin. A thermal treatment is performed to diffuse the dopant in the dielectric dose film into a lower portion of the semiconductor fin.

In accordance with some embodiments of the present disclosure, a device includes a semiconductor substrate and an STI region in the semiconductor substrate. The semiconductor substrate includes a semiconductor strip, with a sidewall of the semiconductor strip contacting a sidewall of the STI region. The STI region includes a liner oxide, which has a bottom portion over and contacting a top surface of the semiconductor substrate, and a sidewall portion contacting the sidewall of the semiconductor strip. The STI region further includes a dielectric dose film over the liner oxide, and a dielectric region over the dielectric dose film. A dopant of n-type or p-type is doped in the dielectric dose film, the liner oxide, and the semiconductor substrate, and dopant concentrations of the dopant decrease from the dielectric dose film to the liner oxide, and from the liner oxide to the semiconductor strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a semiconductor substrate to form trenches, with a portion of the semiconductor substrate between the trenches being a semiconductor strip;
    depositing a blanket dose film on a top surface and sidewalls of the semiconductor strip, wherein the blanket dose film is formed of a dielectric material doped with a dopant of n-type or p-type;
    filling remaining portions of the trenches with a dielectric material, with the dielectric material over the blanket dose film;
    performing a planarization on the dielectric material, wherein remaining portions of the blanket dose film and the dielectric material form Shallow Trench Isolation (STI) regions;
    after the planarization, etching upper portions of the blanket dose film to form a dielectric dose film on a lower portion of a sidewall of the semiconductor strip, wherein a top end of the dielectric dose film is lower than a top surface of the semiconductor strip; and
    performing a thermal treatment to diffuse the dopant in the dielectric dose film into the semiconductor strip, wherein the thermal treatment results in the dopant to be diffused into a bottom portion of the semiconductor strip.

2. The method of claim 1 further comprising performing an additional thermal treatment to diffuse the dopant in the blanket dose film into a top portion of the semiconductor strip.

3. The method of claim 1 further comprising:
    forming a gate stack on a top portion of the semiconductor strip; and
    forming a source/drain region on a side of the gate stack.

4. The method of claim 3, wherein the dopant in the dielectric dose film has a conductivity type opposite to a conductivity type of the source/drain region.

5. The method of claim 1 further comprising performing a thermal oxidation on the semiconductor strip to form a liner oxide, wherein the dielectric dose film is formed over the liner oxide.

6. The method of claim 5, wherein the dielectric material of the blanket dose film is different from a material of the liner oxide.

7. The method of claim 6, wherein the depositing the blanket dose film comprises depositing a silicon nitride film.

8. The method of claim 1, wherein the depositing the blanket dose film comprises depositing a silicon oxide film.

9. A method comprising:
    etching a semiconductor substrate to form trenches, with a portion of the semiconductor substrate between the trenches being a semiconductor strip;
    oxidizing a surface layer of the semiconductor strip to form a liner oxide on sidewalls of the semiconductor strip;
    depositing a dielectric dose film over the liner oxide, wherein the dielectric dose film extends into the trenches, and the dielectric dose film is doped with a first dopant of a first conductivity type;
    etching the liner oxide and the dielectric dose film until top edges of the liner oxide and the dielectric dose film are lower than a top surface of the semiconductor strip; and
    performing a thermal treatment to diffuse the first dopant in the dielectric dose film into the semiconductor strip.

10. The method of claim 9 further comprising:
    filling remaining portions of the trenches with a dielectric material to form Shallow Trench Isolation (STI) regions; and
    etching back the STI regions, wherein the etching back the STI regions comprises the etching the liner oxide and the dielectric dose film, and wherein the thermal treatment is performed to diffuse remaining portions of the dielectric dose film into a lower portion of the semiconductor strip.

11. The method of claim 9, wherein a top portion of the semiconductor strip protrudes over top surfaces of remaining portions of the liner oxide and the dielectric dose film to form a semiconductor fin, and the semiconductor fin is substantially free from dopants diffused from the dielectric dose film.

12. The method of claim 11 further comprising:
forming a gate stack on the semiconductor fin; and
forming a source/drain region on a side of the gate stack, wherein the forming the source/drain region comprises doping a second dopant of a second conductivity type opposite to the first conductivity type.

13. The method of claim 9, wherein the first dopant is in-situ doped into the dielectric dose film when the dielectric dose film is deposited.

14. The method of claim 9 further comprising:
depositing an additional dielectric dose film of a second conductivity type opposite to the first conductivity type over the dielectric dose film, with the thermal treatment further performed on the additional dielectric dose film.

15. A method comprising:
etching a semiconductor substrate to form trenches, with a portion of the semiconductor substrate between the trenches being a semiconductor strip;
forming a liner oxide on sidewalls of a semiconductor strip;
depositing a first dielectric dose film over the liner oxide, wherein the first dielectric dose film extends into the trenches, and the first dielectric dose film is doped with a first dopant of a first conductivity type;
depositing a second dielectric dose film over the first dielectric dose film, wherein the second dielectric dose film is doped with a second dopant of a second conductivity type opposite to the first conductivity type; and
performing a thermal treatment to diffuse the first dopant and the second dopant into the semiconductor strip.

16. The method of claim 15 further comprising:
filling the trenches with a dielectric material, with the dielectric material being over a bottom portion of the second dielectric dose film, wherein the first dielectric dose film, the second dielectric dose film, and the dielectric material in combination form an isolation region; and
etching the isolation region, so that topmost edges of the first dielectric dose film and the second dielectric dose film are lower than a top surface of the semiconductor strip.

17. The method of claim 16, wherein the thermal treatment is performed after the isolation region is etched.

18. The method of claim 15, wherein the thermal treatment comprises a rapid thermal anneal performed at a temperature between about 800° C. and about 1,200° C., with the thermal treatment lasts between about 10 seconds and about 60 seconds.

19. The method of claim 15, wherein the thermal treatment comprises a furnace anneal performed at a temperature between about 400° C. and about 700° C., with the thermal treatment lasts between about 20 minutes and about 5 hours.

20. The method of claim 15, wherein the first dopant diffused from the first dielectric dose film into the semiconductor strip has a higher concentration in the semiconductor strip than the second dopant diffused from the second dielectric dose film.

* * * * *